US009208850B2

(12) United States Patent
Hwang

(10) Patent No.: US 9,208,850 B2
(45) Date of Patent: Dec. 8, 2015

(54) SEMICONDUCTOR MEMORY DEVICE AND SEMICONDUCTOR MEMORY SYSTEM INCLUDING THE SAME

(71) Applicant: SK hynix Inc., Gyeonggi-do (KR)

(72) Inventor: Mi-Hyun Hwang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/470,591

(22) Filed: Aug. 27, 2014

(65) Prior Publication Data
US 2015/0279442 A1    Oct. 1, 2015

(30) Foreign Application Priority Data

Mar. 26, 2014    (KR) .................... 10-2014-0035274

(51) Int. Cl.
| | |
|---|---|
| G11C 7/00 | (2006.01) |
| G11C 11/406 | (2006.01) |
| G11C 19/04 | (2006.01) |
| G11C 8/18 | (2006.01) |
| G11C 29/02 | (2006.01) |
| G06K 19/07 | (2006.01) |
| G06F 7/02 | (2006.01) |
| G11C 11/419 | (2006.01) |
| G11C 11/4076 | (2006.01) |
| G11C 11/4074 | (2006.01) |

(52) U.S. Cl.
CPC ................ *G11C 11/406* (2013.01); *G06F 7/02* (2013.01); *G06K 19/07* (2013.01); *G11C 8/18* (2013.01); *G11C 11/4074* (2013.01); *G11C 11/4076* (2013.01); *G11C 11/419* (2013.01); *G11C 19/04* (2013.01); *G11C 29/02* (2013.01); *G06K 19/0701* (2013.01)

(58) Field of Classification Search
CPC ............. G11C 11/406; G11C 11/4076; G11C 11/4074; G11C 11/419; G11C 8/18; G11C 19/04; G11C 29/02; G06F 7/02; G06K 19/07; G06K 19/0701
See application file for complete search history.

(56) References Cited

U.S. PATENT DOCUMENTS

| | | | | |
|---|---|---|---|---|
| 5,349,556 | A * | 9/1994 | Lee ..................... | G11C 29/808 365/200 |
| 6,144,593 | A * | 11/2000 | Cowles et al. ....... | G11C 29/808 365/189.02 |
| 6,373,775 | B2 * | 4/2002 | Ishikawa ................. | 365/230.03 |

(Continued)

FOREIGN PATENT DOCUMENTS

| | | |
|---|---|---|
| KR | 1020070002999 | 1/2007 |
| KR | 1020130115066 | 10/2013 |

*Primary Examiner* — Pho M Luu
(74) *Attorney, Agent, or Firm* — IP & T Group LLP

(57) ABSTRACT

A semiconductor memory device includes a plurality of normal word lines and a plurality of redundancy word lines which are disposed adjacent to the normal word lines, a detection block suitable for detecting a first word line whose active history satisfies a predetermined condition and a second word line adjacent to the first word line as a target word line and a target neighboring word line, among the normal word lines and the redundancy word lines, and a control block suitable for sequentially refreshing the normal word lines and the redundancy word lines whenever a refresh command is applied, and additionally refreshing the target word line, the target neighboring word line and a normal word line adjacent to the redundancy word lines among the normal word lines.

19 Claims, 7 Drawing Sheets

(56) References Cited

U.S. PATENT DOCUMENTS 7,184,331 B2 * 2/2007 Kim et al. ............ G11C 29/84 365/185.09

7,499,352 B2 * 3/2009 Singh ...................... G11C 8/20 365/200

* cited by examiner

SEMICONDUCTOR MEMORY DEVICE AND SEMICONDUCTOR MEMORY SYSTEM INCLUDING THE SAME

CROSS-REFERENCE TO RELATED APPLICATIONS

The present application claims priority of Korean Patent Application No. 10-2014-0035274, filed on Mar. 26, 2014, which is incorporated herein by reference in its entirety.

BACKGROUND

1. Field

Exemplary embodiments of the present invention relate to a semiconductor design technology and, more particularly, to a semiconductor memory device that may prevent data stored in a memory cell from being damaged or lost due to word line disturbance and a semiconductor memory system including the semiconductor memory device.

2. Description of the Related Art

As the integration degree of a memory device increases, the space between the word lines becomes narrower. As the gap between the word lines becomes narrower, the coupling effect between neighboring word lines increases.

Voltage levels of word lines toggle between an activation state and a deactivation state whenever data is inputted to/outputted from a memory cell. As the coupling effect between neighboring word lines increases, data may be affected in memory cells coupled to word lines that are adjacent to a frequently activated word line. This phenomenon is referred to as word line disturbance. In a worst case scenario, the data of a memory cell may be damaged to the point it is no longer recoverable, before the memory cell is refreshed, resulting in a loss of data.

FIG. 1 illustrates a portion of a cell array included in a memory device for describing word line disturbance.

Referring to FIG. 1, a word line WLL is activated a large number of times, and word lines WLL−1 and WLL+1 are disposed adjacent to the word line WLL. A memory cell CL is coupled with the word line WLL, and a memory cell CL−1 is coupled with the word line WLL−1, and a memory cell CL+1 is coupled with the word line WLL+1. The memory cells CL, CL−1 and CL+1 include cell transistors TL, TL−1 and TL+1 and cell capacitors CAPL, CAPL−1 and CAPL+1, respectively.

In FIG. 1, when the word line WLL is activated or deactivated, voltages of the word lines WLL−1 and the WLL+1 increase or decrease due to a coupling effect occurring between the word line WLL and the word line WLL−1 or the word line WLL and the word line WLL+1. The coupling effect has an influence on the charge of the cell capacitors CAPL−1 and CAPL+1. Therefore, when the voltage level of the word line WLL toggles between an activation state and a deactivation state, changes in the amount of charge stored in the cell capacitors CAPL−1 and CAPL+1 included in the memory cells CL−1 and CL+1 may increase, and data of the memory cells CL−1 and CL+1 may be damaged or even lost.

Also, data may be damaged or lost as electromagnetic waves are generated by neighboring circuits that are toggling between active and non-active states. These electromagnetic waves may induce an increase or decrease in the charge of capacitors in neighboring memory cells. And, as previously discussed, unintended changes in the charge of neighboring memory cells may result in the loss of data.

SUMMARY

Exemplary embodiments of the present invention are directed to a semiconductor memory device that may prevent a data of a memory cell coupled with a word line from being damaged due to a word line disturbance by activating the word line and refreshing the memory cell when the word line is adjacent to another word line whose number of times being activated is equal to or greater than a predetermined number.

Also, exemplary embodiments of the present invention are directed to a semiconductor memory device that may prevent a data of a memory cell coupled with a redundancy word line, which is substituted for a normal word line, from being damaged when the redundancy word line is adjacent to another redundancy word line whose the number of times being activated is equal to or greater than a predetermined number.

Also, exemplary embodiments of the present invention are directed to a semiconductor memory device that may prevent a data of a memory cell coupled with a normal word line from being damaged even when the word line is adjacent to a redundancy word line whose the number of times being activated is equal to or greater than a predetermined number.

In accordance with an embodiment of the present invention, a semiconductor memory device includes a plurality of normal word lines and a plurality of redundancy word lines which are disposed adjacent to the normal word lines, a detection block suitable for detecting a first word line whose active history satisfies a predetermined condition and a second word line adjacent to the first word line as a target word line and a target neighboring word line, among the normal word lines and the redundancy word lines, and a control block suitable for sequentially refreshing the normal word lines and the redundancy word lines whenever a refresh command is applied, and additionally refreshing the target word line, the target neighboring word line and a normal word line adjacent to the redundancy word lines among the normal word lines.

In accordance with another embodiment of the present invention, a semiconductor system includes a semiconductor memory device including a plurality of normal word lines and a plurality of redundancy word lines which are disposed adjacent to the normal word lines, and suitable for sequentially refreshing the normal word lines and the redundancy word lines whenever a refresh command is applied, and additionally refreshing a target word line, a target neighboring word line adjacent to the target word line and a normal word line adjacent to the redundancy word lines among the normal word lines and the redundancy word lines, and a semiconductor controller suitable for detecting a word line whose active history satisfies a predetermined condition among the normal word lines and the redundancy word line as the target word line, and transmitting a detection result to the semiconductor memory device.

DETAILED DESCRIPTION

Figure 1:
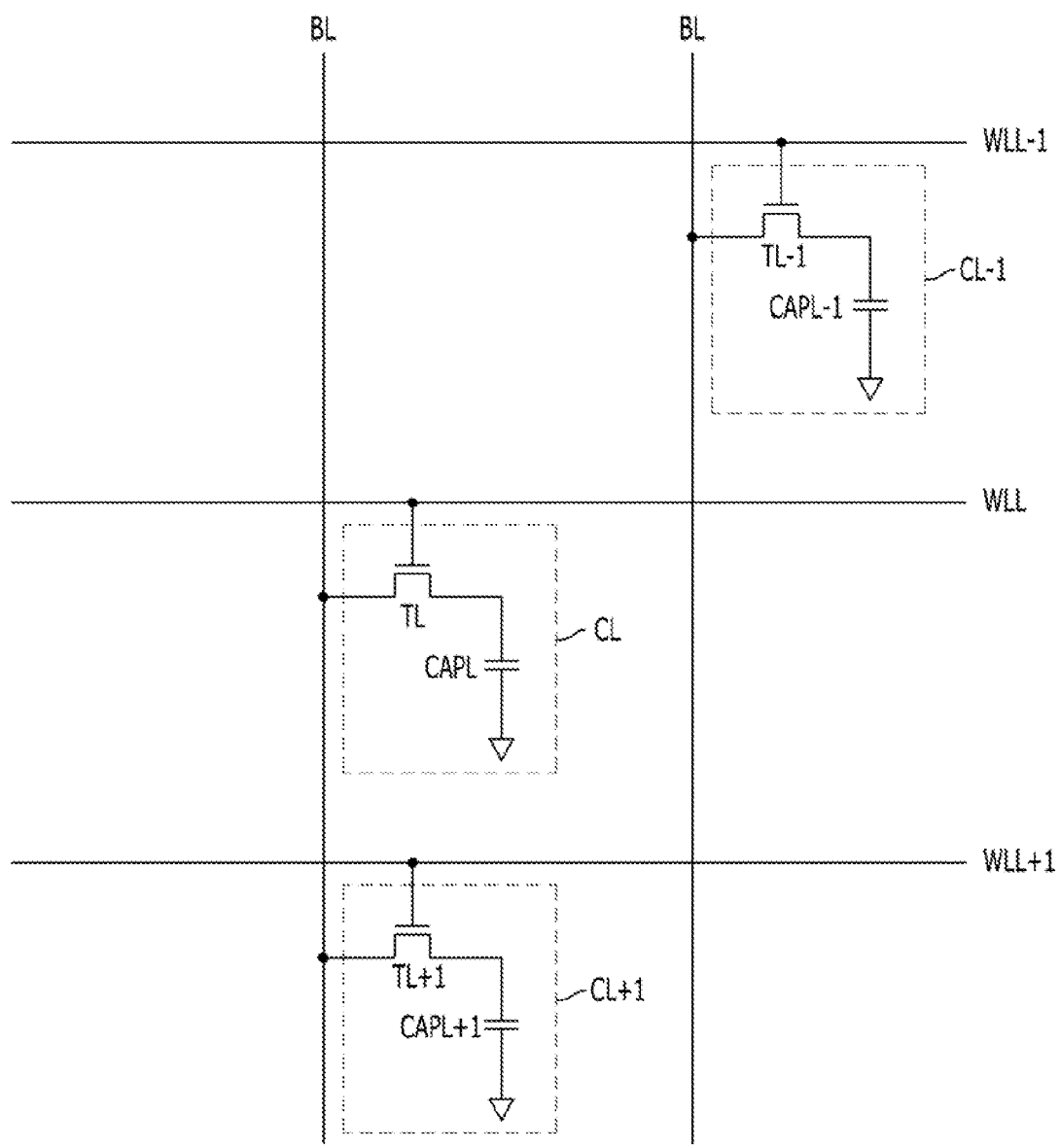
FIG. 1 illustrates a portion of a cell array included in a memory for describing a word line disturbance.

Exemplary embodiments of the present invention are described below in more detail with reference to the accompanying drawings. These embodiments are provided so that this disclosure is thorough and complete and fully conveys the scope of the present invention to those skilled in the art. The drawings are not necessarily to scale and, in some instances, proportions may have been exaggerated to clearly illustrate features of the embodiments. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form, and vice versa, as long as it is not specifically mentioned in a sentence.

Figure 2:
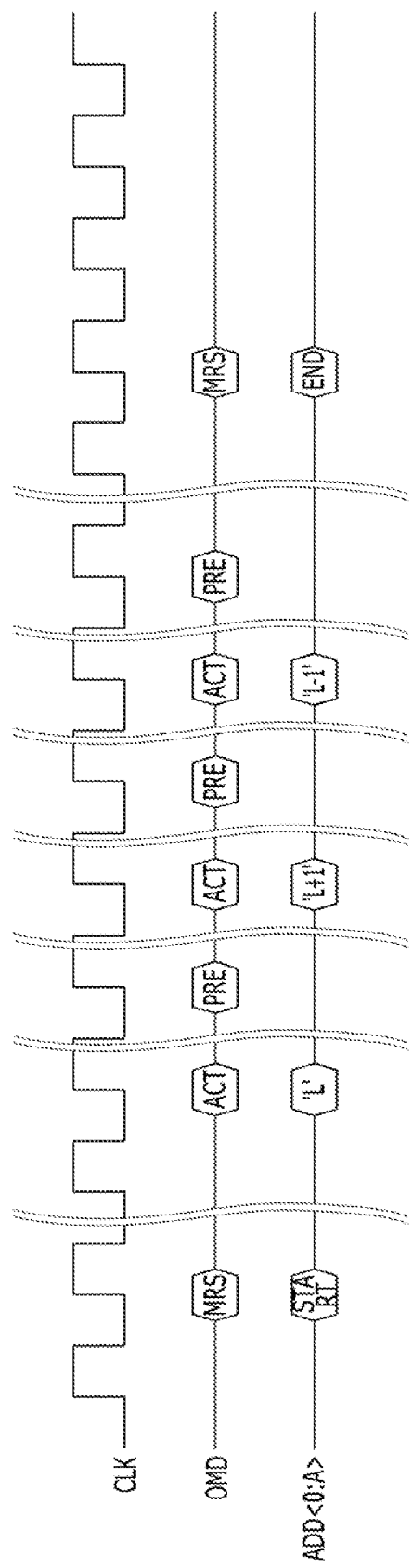
FIG. 2 illustrates an operation for preventing data of a memory cell, adjacent to a target word line having a high a high activation frequency, from being deteriorated or lost due to word line disturbance.

FIG. 2 illustrates an operation for preventing data of a memory cell adjacent to a target word line having a high a high activation frequency, from being deteriorated or lost due to word line disturbance.

Referring to FIG. 2, a semiconductor memory device includes a plurality of word lines, and a semiconductor controller (not shown) that controls the semiconductor memory device by applying various signals such as command signals CMD, addresses ADD and data (not shown) to the semiconductor memory device. Hereinafter, a value of an address corresponding to an $L^{th}$ word line, where L is a natural number greater than 1, among the word lines, is represented by 'L'.

The semiconductor memory device and the semiconductor controller detect a target address of a target word line, whose the number of times being activated/precharged is great or the frequency of being activated/precharged is high, among the word lines in a predetermined way.

When the target address is detected, the semiconductor controller applies the command signals CMD and the addresses ADD to the semiconductor memory device so that the semiconductor memory device may perform a target refresh operation. The semiconductor memory device starts to perform the target refresh operation in response to the applied command signals CMD and addresses ADD.

During the target refresh operation, the semiconductor controller applies the target address and an address (hereafter, refer to as 'a neighboring address') corresponding to a word line adjacent to the target word fine to the semiconductor memory device. A case where the target address is 'L' is described below.

During the target refresh operation, the target address L is applied to the semiconductor memory device with a first active command ACT, and a precharge command PRE is applied to the semiconductor memory device after a predetermined time passes. The semiconductor memory device activates and then precharges or deactivates the target word line.

Subsequently, neighboring addresses L+1 and L−1 are sequentially applied. In FIG. 2, the neighboring address L−1 is applied with a second active command ACT, and the neighboring address L+1 is applied with a third active command ACT. Therefore, neighboring word lines WLL−1 and WLL+1 corresponding to the neighboring addresses L−1 and L+1 are activated, and memory cells coupled with the neighboring word lines WLL−1 and WLL+1 are refreshed. The order in which the neighboring addresses L−1 and L+1 are applied may change.

When a word line is activated, data of memory cells coupled with the word line is refreshed. Therefore, when the target word line L and the neighboring addresses L−1 and L+1 are applied from the semiconductor controller to the semiconductor memory device in the above manner, data may be prevented from being damaged due to word line disturbance.

Figure 3:
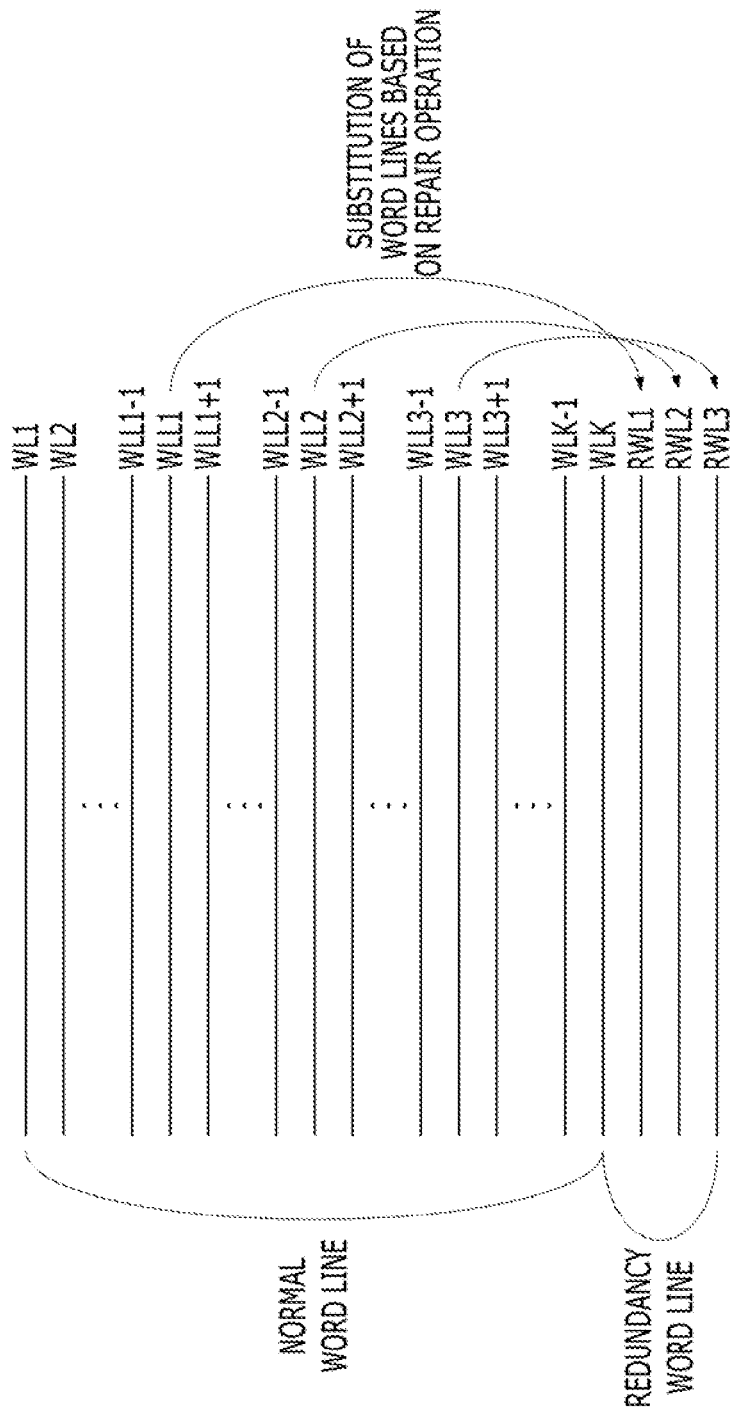
FIG. 3 illustrates a problem that occurs when a target refresh operation is performed according to a method shown in FIG. 2.

FIG. 3 illustrates a problem occurring when the target refresh operation is performed by a method shown in FIG. 2.

Referring to FIG. 3, the semiconductor memory device includes a plurality of normal word lines WL1 to WLK which are normally used and a plurality of redundancy word lines RWL1, RWL2 and RWL3 that substitute for defective normal word lines WLL1, WLL2 and WLL3 among the normal word lines WL1 to WLK, and the normal word lines WL1 to WLK and the redundancy word lines RWL1, RWL2 and RWL3 are disposed adjacent to each other.

The semiconductor memory device stores values L1, L2 and L3 of addresses corresponding to the defective normal word lines WLL1, WLL2 and WLL3, and perform a repair operation where the redundancy word lines RWL1, RWL2 and RWL3 are substituted for the defective normal word lines WLL1, WLL2 and WLL3, when values of inputted addresses RADD<0:A> are the same as the stored values L1, L2 and L3. Addresses are not assigned to the redundancy word lines RWL1, RWL2 and RWL3 until the defective normal word lines WLL1, WLL2 and WLL3 are substituted through the repair operation. However, when the repair operation is performed, the values L1, L2 and L3 of addresses corresponding to the defective normal word lines WLL1, WLL2 and WLL3 are assigned to correspond to the redundancy word lines RWL1, RWL2 and RWL3.

Referring to FIGS. 2 and 3, when a value of the target address is L2 in the target refresh operation, the first active command ACT and an address L2 are inputted. Therefore, the second redundancy word line RWL2 is activated instead of the second defective normal word line WLL2 in response to the first active command ACT. Subsequently, the second and third active commands ACT and addresses L2+1 and L2−1 are inputted. Therefore, a $(L2+1)^{th}$ normal word line WLL2+1 and a $(L2−1)^{th}$ normal word line WLL2−1 adjacent to the second defective normal word line WLL2 are activated in response to the second and third active commands ACT.

Since the second defective normal word line WLL2 is substituted with the second redundancy word line RWL2, the second redundancy word line RWL2 is activated equal to or greater than a predetermined number of times in the actual conditions (not the second defective normal word line WLL2). Therefore, the first redundancy word line RWL1 and the third redundancy word line RWL3, which are disposed adjacent to the second redundancy word line RWL2, are to be additionally activated through the target refresh operation (not the $(L2+1)^{th}$ normal word line WLL2+1 and the $(L2−1)^{th}$ normal word line WLL2−1 which are disposed adjacent to the second defective normal word line WLL2).

As described above, when the defective normal word lines WLL1, WLL2 and WLL3 are substituted and selected as the target word lines, the target refresh operation is not applied as intended.

Figure 4:
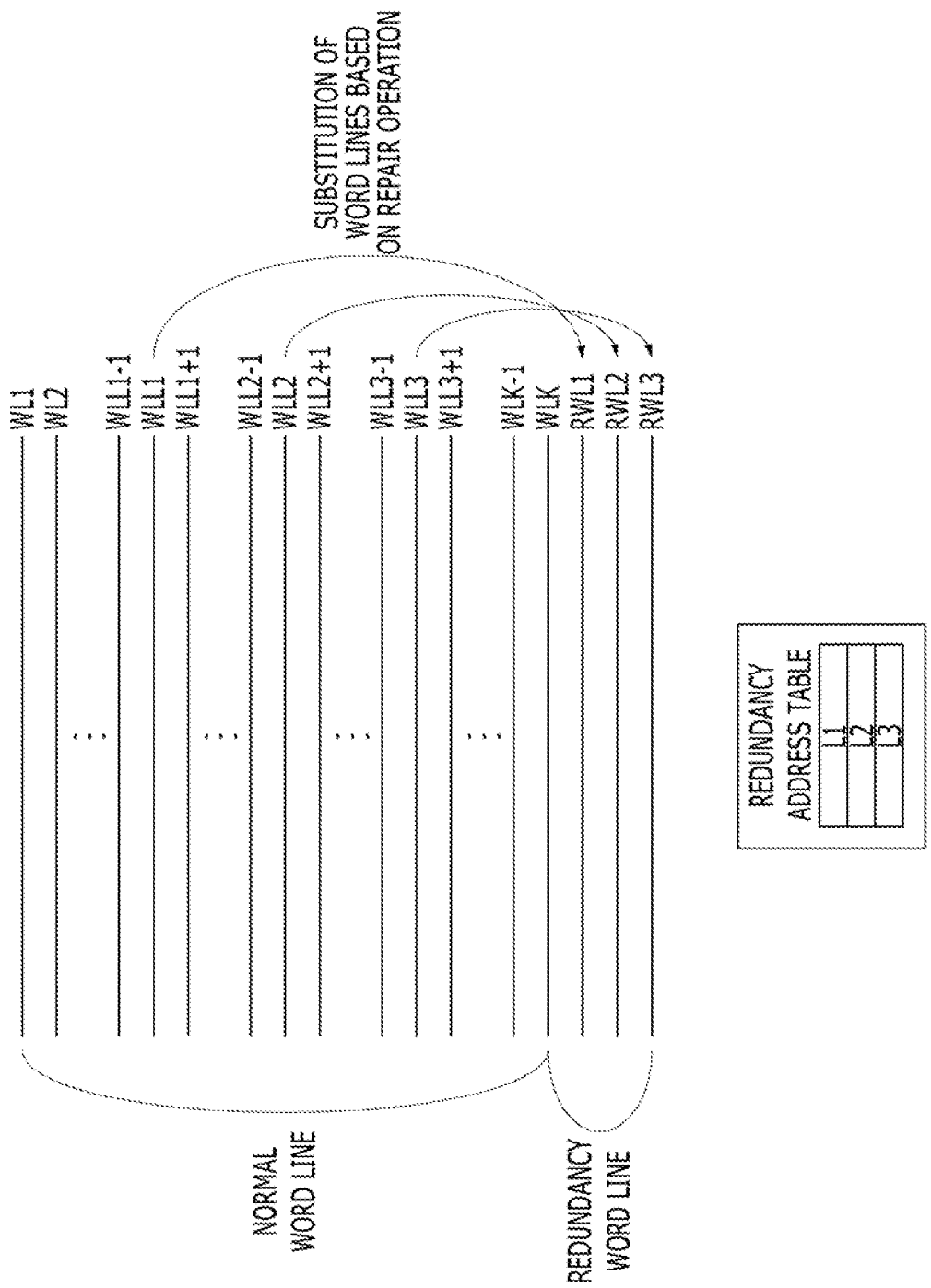
FIG. 4 illustrates a target refresh operation that may solve the problem shown in FIG. 3.

FIG. 4 illustrates a target refresh operation that may solve the problem shown in FIG. 3.

Referring to FIG. 4, the semiconductor memory device includes the normal word lines WL1 to WLK which are normally used and the redundancy word lines RWL1 RWL2 and RWL3 that substitute for defective normal word lines WLL1, WLL2 and WLL3 among the normal word lines WL1 to WLK, and the normal word lines WL1 to WLK and the redundancy word lines RWL1, RWL2 and RWL3 are disposed adjacent to each other. Also, the semiconductor memory device includes a redundancy address table 40 where the addresses corresponding to the redundancy word lines RWL1, RWL2 and RWL3, i.e., the values L1, L2 and L3 of the addresses corresponding to the defective normal word lines WLL1, WLL2 and WLL3, are gathered.

When the values of the addresses corresponding to the defective normal word lines WLL1, WLL2 and WLL3 are inputted as the value of the target address during the target refresh operation, the values of the addresses corresponding to the redundancy word lines RWL1, RWL2 and RWL3 may be selected as the addresses adjacent to the target address by using the redundancy address table 40, instead of the values of the addresses corresponding to the word lines WLL1−1, WLL+1, WLL2−1, WLL2+1, WLL3−1 and WLL3+1 which are disposed adjacent to the defective normal word lines WLL1, WLL2 and WLL3.

For example, when the value of the target address is L2 during the target refresh operation, the first active command ACT and an address L2 are inputted. Therefore, the second redundancy word line RWL2 is activated instead of the second defective normal word line WLL2 in response to the first active command ACT. The addresses which are disposed adjacent to the value L2 of the target address are stored as L1 and L3 in the redundancy address table 40. The second and third active commands ACT and addresses L1 and L3 are inputted. Therefore, the first redundancy word line RWL1 and the third redundancy word line RWL3, which are disposed adjacent to the second redundancy word line RWL2, are activated in response to the second and third active commands ACT.

As described above, when the defective normal word lines WLL1, WLL2 and WLL3 are selected as the target word line, the target refresh operation may be performed by using the redundancy address table 400 to directly select the redundancy word lines RWL1, RWL2 and RWL3.

However, the target refresh operation may not achieve its purpose even when the redundancy address table 40 is applied to the target refresh operation as shown in FIG. 4.

For example, when the value of the target address is L1 during the target refresh operation, the first active command Act and an address having a value of L1 are inputted. Therefore, the first redundancy word line RWL1 is activated instead of the first defective normal word line WLL1 in response to the first active command ACT, The address which is disposed adjacent to the value L1 of the target address is stored as L2 in the redundancy address table 40. In other words, the neighboring redundancy word line is just the second redundancy word line RWL2 since the first redundancy word line RWL1 is selected among the redundancy word lines RWL1, RWL2 and RWL3. The third active command ACT is not inputted, and the second active command ACT and an address having a value of L2 are inputted. As a result, the second redundancy word line RWL2, which is disposed adjacent to the first redundancy word line RWL1, is activated in response to the second active command ACT.

However, the word line which is disposed adjacent to the first redundancy word line RWL1 is not just the second redundancy word line RWL2. In other words, the normal word line WLK which is disposed adjacent to the redundancy word lines RWL1, RWL2 and RWL3 among the normal word lines WL1 to WLK is also the word line which is disposed adjacent to the first redundancy word line RWL1. However, since the normal word lines WLL1, WLL2 and WLL3 and the redundancy word lines RWL1, RWL2 and RWL3 are selected to be completely separated from each other during the target refresh operation, the normal word line WLK which is disposed adjacent to the redundancy word lines RWL1, RWL2 and RWL3 may not be included in the target refresh operation.

In order to prevent the aforementioned problem from occurring, it is necessary to change the structure to include a dummy word line (not shown) between the normal word lines WL1 to WLK and the redundancy word lines RWL1, RWL2 and RWL3. However, the change in structure may cause an increase in the area of the semiconductor memory device.

For the aforementioned reason, the target refresh operation may not achieve its purpose even when the redundancy address table 40 is applied to the target refresh operation as shown in FIG. 4.

First Embodiment

Figure 5:
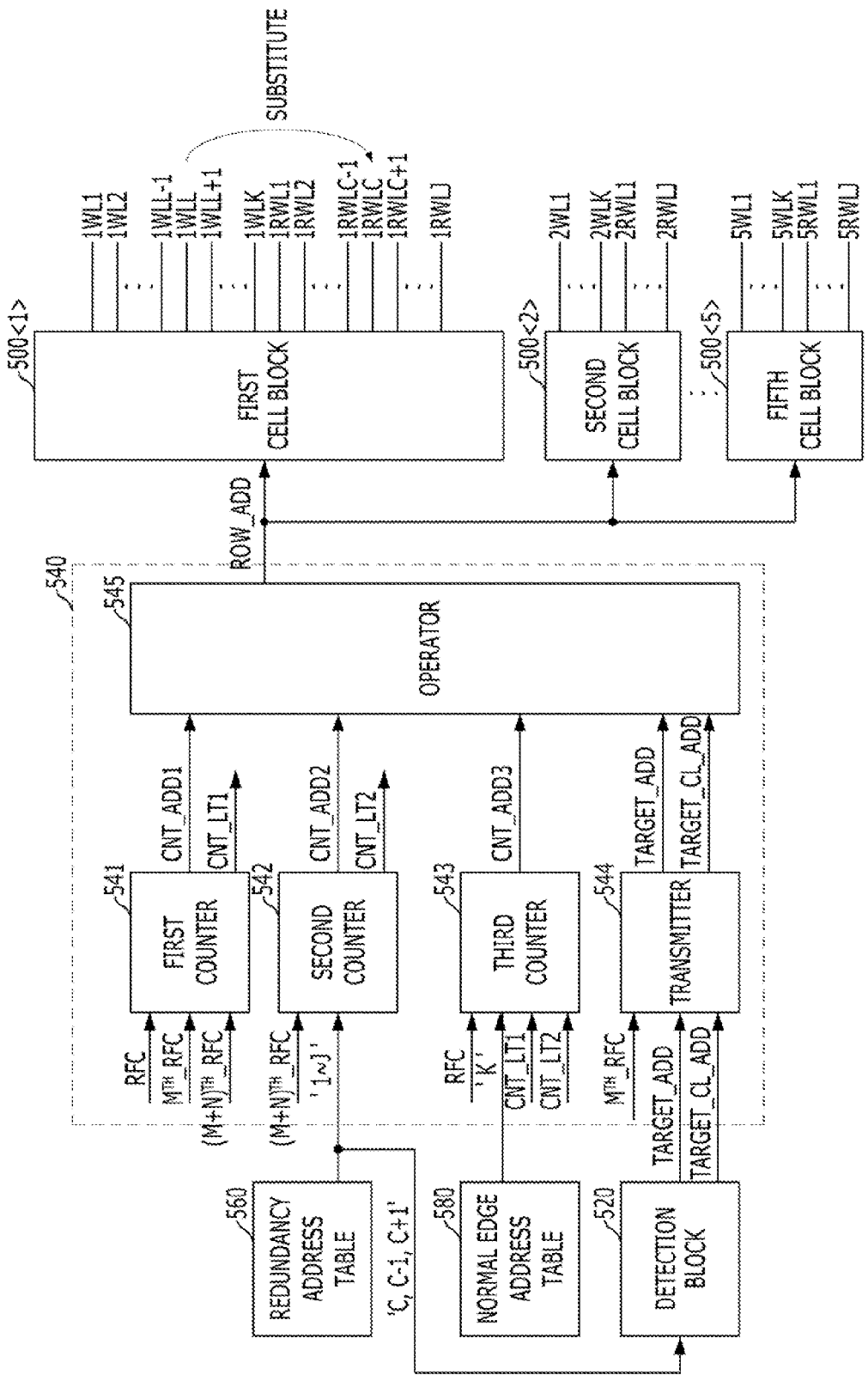
FIG. 5 is a block diagram illustrating a semiconductor memory device in accordance with a first embodiment of the present invention.

FIG. 5 is a block diagram illustrating a semiconductor memory device in accordance with a first embodiment of the present invention.

Referring to FIG. 5, the semiconductor memory device in accordance with the first embodiment of the present invention includes a plurality of cell blocks 500<1:5>, a detection block 520, a control block 540, a redundancy address table 560 and a normal edge address table 580. Each of the cell blocks 500<1:5> includes a plurality of normal word lines 1WL1 to 1WLK, 2WL1 to 2WLK, 3WL1 to 3WLK, 4WL1 to 4WLK or 5WL1 to 5WLK and a plurality of redundancy word lines 1RWL1 to 1RWLJ, 2RWL1 to 2RWLJ, 3RWL1 to 3RWLJ, 4RWL to 4RWLJ or 5RWL to 5RWLJ. The control block 540 includes a first counter 541, a second counter 542, a third counter 543, a transmitter 544 and an operator 545.

The cell blocks 500<1:5> are physically divided. The normal word lines 1WL1 to 1WLK, 2WL1 to 2WLK, 3WL1 to 3WLK, 4WL1 to 4WLK or 5WL1 to 5WLK and the redundancy word lines 1RWL1 to 1RWLJ, 2RWL1 to 2RWLJ, 3RWL1 to 3RWLJ, 4RWL to 4RWLJ or 5RWL to 5RWLJ included in each of the cell blocks 500<1:5> are disposed adjacent to each other.

The cell blocks 500 1:5> may have the same structure, Therefore, the following description is made on the basis of an operation to be performed on the first cell block 500<1> among the cell blocks 500<1:5>. An extended structure is described in an operation where all of the cell blocks 500<1:5> are required.

The detection block 520 detects a normal word line whose active history satisfies a predetermined condition among the normal word lines 1WL1 to 1WLK as a target word line. When one normal word line 1WLL among the normal word lines 1WL1 to 1WLK is detected as the target word line from the detection block 520, one or more normal word lines 1WLL−1 and 1WLL+1, which are disposed adjacent to the normal word line 1WLL, detected by the detection block 520, may be adjacent word lines of the target word line. Also, when one normal word line 1WLL among the normal word lines 1WL1 to 1WLK is substituted with one redundancy word line 1RWLC among the redundancy word lines 1RWL1 to 1RWLJ, and then the redundancy word line 1RWLC is detected as a target word line from the detection block 520, one or more redundancy word lines 1RWLC−1 and 1RWLC+1, which are disposed adjacent to the redundancy word line 1RWLC detected by the detection block 520, may be adjacent word lines of the target word line.

To be specific, the detection block 520 detects a target address TARGET_ADD corresponding to the target word line whose active history satisfies a predetermined condition. Also, the detection block 520 detects target neighboring addresses TARGET_CL_ADD corresponding to the word lines which are disposed adjacent to the target word line by performing a predetermined operation on the target address TARGET_ADD. For example, when a value 'L' of an address corresponding to the normal word line 1WLL among the normal word lines 1WL1 to 1WLK is detected as the target address TARGET_ADD from the detection block 520, values L−1, and L+1 of the target neighboring addresses TARGET_CL_ADD are determined through an operation of adding or subtracting 1 to or from a value 'L' of the target address TARGET_ADD. When the normal word line 1WLL among the normal word lines 1WL1 to 1WLK is substituted with the redundancy word line 1RWLC among the redundancy word lines 1RWL1 to 1RWLJ through a repair operation, and a value 'C' of an address corresponding to the redundancy word line 1RWLC is detected as the target address TARGET_ADD from the detection block 520, values C−1 and C+1 of addresses corresponding to one or more redundancy word lines 1RWLC−1 and 1RWLC+1 which are disposed adjacent to the redundancy word line 1RWLC corresponding to the target address TARGET_ADD are selected in the redundancy address table 560, and then determined as the target neighboring addresses TARGET_CL_ADD.

The normal word line 1WLK among the normal word lines 1WL1 to 1WLK is disposed adjacent to the redundancy word lines 1RWL1 to 1RWLJ, i.e., the outermost redundancy word line 1RWL1 among the redundancy word lines 1RWL1 to 1RWLJ.

A value 'K' of an address corresponding to the normal word line 1WLK which is disposed adjacent to the outermost redundancy word line 1RWL1 disposed next to the normal word lines 1WL1 to 1WLK among the redundancy word lines 1RWL1 to 1RWLJ is gathered in the normal edge address table 580. In case of the first block 500<1> among the cell blocks 500<1:5>, the one normal word line 1WLK is disposed adjacent to the redundancy word lines 1RWL1 to 1RWLJ. However, in all the cell blocks 500<1:5>, the number of the normal word lines which are disposed adjacent to the redundancy word lines may be five, which is the same as the number of the cell blocks.

In the drawing, the normal word lines 1WL1 to 1WLK and the redundancy word lines 1RWL1 to 1RWLJ are grouped in one cell block. Just one normal word line 1WLK which is disposed adjacent to the redundancy word lines 1RWL1 to 1RWLJ exists in one cell block. However, unlike the drawing, when a plurality of cell mats (not shown) are included in one cell block, and the normal word lines 1WL1 to 1WLK and the redundancy word lines 1RWL1 to 1RWLJ are grouped in each mat, the number of the normal word lines 1WLK which are disposed adjacent to the redundancy word lines 1RWL1 to 1RWLJ may increase.

Values 1 to J of addresses corresponding to the redundancy word lines 1RWL1 to 1RWLJ are gathered in the redundancy address table 560. Since the redundancy word lines 1RWL1 to 1RWLJ are used for substituting for defective word lines among the normal word lines 1WL1 to 1WLK, the values 1 to J of the addresses corresponding to the redundancy word lines 1RWL1 to 1RWLJ may be the values of the addresses corresponding to defective normal word lines among the normal word lines 1WL1 to 1WLK.

The control block 540 sequentially refreshes the normal word lines 1WL1 to 1WLK and the redundancy word lines 1RWL1 to 1RWLJ whenever a refresh command RFC is applied, and additionally refreshes the target word line 1WLL or 1RWLC, the word lines 1WLL−1 and 1WLL+1 or 1RWLC−1 and 1RWLC+1 which are disposed adjacent to the target word line 1WLL or 1RWLC, and the word line 1WLK which is disposed adjacent to the redundancy word lines 1RWL1 to 1RWLJ among the normal word lines 1WL1 to 1WLK.

To be specific, the control block 540 performs a first refresh operation to sequentially refresh the normal word lines 1WL1 to 1WLK whenever the refresh command RFC is applied. The control block 540 performs a second refresh operation to sequentially refresh the target word line 1WLL or 1RWLC and the word lines 1WLL−1 and 1WLL+1 or 1RWLC−1 and 1RWLC+1 which are disposed adjacent to the target word line 1WLL or 1RWLC while the first refresh operation stops whenever the refresh command RFC is applied at an $M^{th}$ time $M^{th}\_RFC$. The control block 540 performs a third refresh operation to sequentially refresh the redundancy word lines 1RWL1 to 1RWLJ while the first refresh operation stops whenever the refresh command RFC is applied at an $(M+N)^{th}$ time $(M+N)^{th}\_RFC$. The control block 540 performs a fourth refresh operation to refresh the word line 1WLK which is disposed adjacent to the redundancy word lines 1RWL1 to 1RWLJ among the normal word lines 1WL1 to 1WLK whenever the refresh command RFC is applied after the normal word lines 1WL1 to 1WLK and the redundancy word lines 1RWL1 to 1RWLJ are refreshed one or more times during the first to third refresh operations.

Although the first refresh operation is essentially performed whenever the refresh command RFC is applied, the second refresh operation is performed while the first refresh operation stops whenever the refresh command RFC is applied an $M^{th}$ time $M^{th}\_RFC$. For example, the first refresh operation is performed until the refresh command RFC is applied from a first time to a $(M−1)^{th}$ time $(M−1)^{th}\_RFC$, and then the second refresh operation is performed when the refresh command RFC is applied at the M time $M^{th}\_RFC$. Subsequently the first refresh operation is performed until the refresh command RFC is applied from an $(M+1)^{th}$ time $(M+1)^{th}\_RFC$ to a $(2M−1)^{th}$ time $(2M−1)^{th}\_RFC$, and then the second refresh operation is performed when the refresh command RFC is applied at a $2M^{th}$ time $2M^{th}\_RFC$.

Similarly, although the first refresh operation is essentially performed whenever the refresh command RFC is applied the third refresh operation is performed while the first refresh operation stops whenever the refresh command RFC is applied at the $(M+N)^{th}$ time $(M+N)^{th}\_RFC$. For example, the first refresh operation is performed until the refresh command RFC is applied from a first time to a $(M+N−1)^{th}$ time $(M+N−1)^{th}\_RFC$, and then the third refresh operation is performed when the refresh command RFC is applied at the $(M+N)^{th}$ time $(M+N)^{th}\_RFC$ Subsequently the first refresh operation is performed until the refresh command RFC is applied from a $(M+N+1)^{th}$ time $(M+N+1)^{th}\_RFC$ to a $(2M+2N−1)^{th}$ time $(2M+2N−1)^{th}\_RFC$, and then the third refresh operation is performed when the refresh command RFC is applied at a $2(M+N)^{th}$ time $2(M+N)^{th}$ RFC.

The first counter 541 sequentially counts the values 1 to K of the addresses corresponding to the normal word lines 1WL1 to 1WLK and outputs an address CNT_ADD1 whenever the refresh command RFC is applied, and a counting operation stops whenever the refresh command RFC is applied at the $M^{th}$ time $M^{th}\_RFC$ and the $(M+N)^{th}$ time $(M+N)^{th}\_RFC$.

The transmitter 544 sequentially outputs the target address TARGET_ADD and the target neighboring address TARGET_CL_ADD, which are generated in the detection block 520 whenever the refresh command RFC is applied at the $M^{th}$ time $M^{th}$_RFC.

The second counter 542 counts the values 1 to J of the addresses corresponding to the redundancy word lines 1RWL1 to 1RWLJ and outputs an address CNT_ADD2 whenever the refresh command RFC is applied at the $(M+N)^{th}$ time $(M+N)^{th}$_RFC. The values 1 to J of the addresses corresponding to the redundancy word lines 1RWL1 to 1RWLJ are already stored in the redundancy address table 560, and they may be the values which are selected as much as J among the values 1 to K of the addresses corresponding to the normal word lines 1WL1 to 1WLK through the repair operation.

The third counter 543 counts the value 'K' of the address corresponding to the normal word line 1WLK adjacent to the redundancy word lines 1RWL1 to 1RWLJ among the normal word lines 1WL1 to 1WLK and outputs an address CNT_ADD3 in response to the refresh command RFC applied after counting all the normal word lines 1WL1 to 1WLK and the redundancy word lines 1RWL1 to 1RWLJ in the first counter 541 and the second counter 542. The address corresponding to the normal word line 1WLK adjacent to the redundancy word lines 1RWL1 to 1RWLJ among the normal word lines 1WL1 to 1WLK has a value which is already stored in the normal edge address table 580, and the number and the value of the address may be determined based on the number of the cell blocks 500<1:5> or the number of the cell mats (not shown) which may be included in each of the cell blocks 500<1:5>. The third counter 543 counts the value 'K' of the address corresponding to the normal word line 1WLK adjacent to the redundancy word lines 1RWL1 to 1RWLJ among the normal word lines 1WL1 to 1WLK and outputs the address CNT_ADD3 in response to the refresh command RFC applied after a signal CNT_LT1 indicating that the counting operation of the first counter 541 is completed and a signal CNT_LT2 indicating that the counting operation of the second counter 542 is completed are enabled.

The operator 545 performs a refresh operation which activates-precharges the normal word lines 1WL1 to 1WLK and the redundancy word lines 1RWL1 to 1RWLJ in response to the address CNT_ADD1 outputted from the first counter 541, the address CNT_ADD2 outputted from the second counter 542, the address CNT_ADD3 outputted from the third counter 543 and the addresses TARGET_ADD and TARGET_CL_ADD outputted from the transmitter 544.

Figure 6:
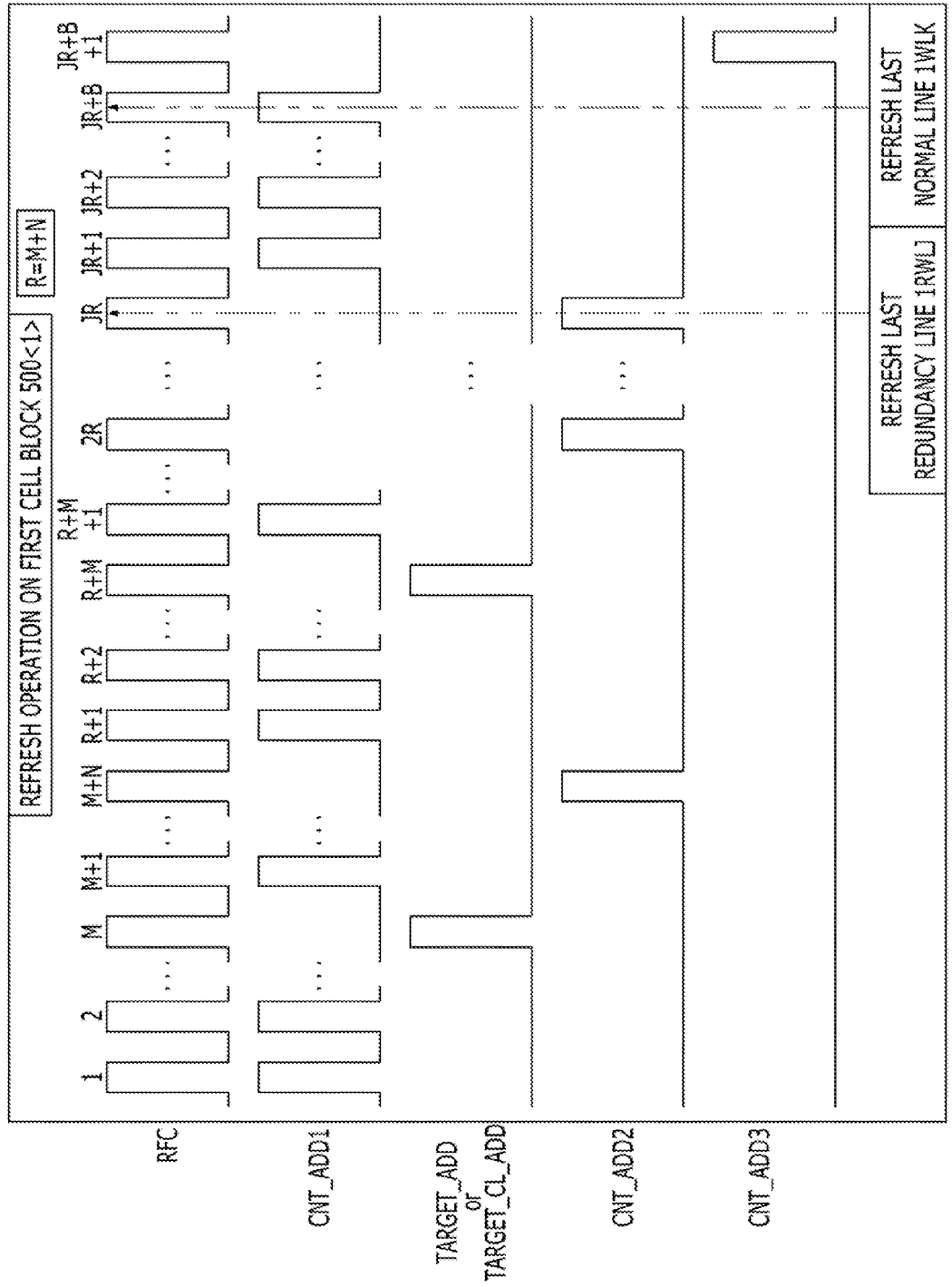
FIG. 6 is a timing diagram illustrating an operation of the semiconductor memory device in accordance with the first embodiment of the present invention shown in FIG. 5.

FIG. 6 is a timing diagram illustrating an operation of the semiconductor memory device in accordance with the first embodiment of the present invention shown in FIG. 5.

Referring to FIG. 6, the semiconductor memory device in accordance with the first embodiment of the present invention performs a refresh operation on each of the cell blocks 500<1:5>. In other words, the refresh operation is completed on the first cell block 500<1> among the cell blocks 500<1:5>, and subsequently the refresh operation is performed on the second cell block 500<1:5> to sequentially refresh the five cell blocks 500<1:5>.

Also, the refresh operation is performed on each of the cell blocks 500<1:5> through a series of processes of sequentially refreshing the normal word lines 1WL1 to 1WLK and the redundancy word lines 1RWL1 to 1RWLJ in response to the refresh command RFC that is applied, refreshing the target word line and the word line which is disposed adjacent to the target word line, and additionally refreshing the normal word line which is disposed adjacent to the redundancy word lines 1RWL1 to 1RWLJ among the normal word fines 1WL1 to 1WLK.

To be specific, the address CNT_ADD1 corresponding to the normal word lines 1WL1 to 1WLK is counted whenever the refresh command RFC is applied until the refresh command RFC is inputted from a first time 1 to an $(M-1)^{th}$ time. Therefore, a normal refresh operation in which M-1 normal word lines among the normal word lines 1WL1 to 1WLK are sequentially refreshed is performed first.

Subsequently, the target address TARGET_ADD corresponding to the target word line is counted in response to the refresh command RFC that is inputted at an $M^{th}$ time. Therefore, a target refresh operation in which one word line, detected as a target word line among the normal word lines 1WL1 to 1WLK and the redundancy word lines 1RWL1 to 1RWLJ, is refreshed is performed first. When a normal word line selected as a target word line among the normal word lines 1WL1 to 1WLK is in a normal condition, the selected normal word line may be refreshed as the target word line as it is, and when a normal word line selected as a target word line among the normal word lines 1WL1 to 1WLK is a defective word line, a redundancy word line which is substituted for the selected normal word line may be refreshed as the target word line.

Subsequently, the address CNT_ADD1 corresponding to the normal word lines 1WL1 to 1WLK is counted whenever the refresh command RFC is applied until the refresh command RFC is inputted from an $(M+1)^{th}$ time to an $(M+N-1)^{th}$ time. Therefore, the normal refresh operation in which (N-1) normal word lines among the normal word lines 1WL1 to 1WLK are sequentially refreshed is performed second.

Subsequently, the address CNT_ADD2 corresponding to the redundancy word lines 1RWL1 to 1RWLJ is counted in response to the refresh command RFC that is inputted at an $(M+N)^{th}$ time. Therefore, a redundancy refresh operation in which the first redundancy word line 1RWL1 among the redundancy word lines 1RWL1 to 1RWLJ is refreshed is performed first. Herein, 'R' indicates 'M+N', and 'M+N' is replaced with 'R' in the following description.

Subsequently, the address CNT_ADD1 corresponding to the normal word lines 1WL1 to 1WLK is counted whenever the refresh command RFC is applied until the refresh command RFC is inputted from an $(R+1)^{th}$ time to an $(R+M-1)^{th}$ time. Therefore, the normal refresh operation in which (M-1) normal word lines among the normal word lines 1WL1 to 1WLK are sequentially refreshed is performed third.

Subsequently, the address TARGET_CL_ADD corresponding to the word line adjacent to the target word line is counted in response to the refresh command RFC that is inputted at an $(R+M)^{th}$ time. Therefore, the target refresh operation in which one word line adjacent to the target word line among the normal word lines 1WL1 to 1WLK and the redundancy word lines 1RWL to 1RWLJ is refreshed is performed second. When one normal line among the normal word lines 1WL1 to 1WLK is refreshed as the target word line during the first target refresh operation, one normal word line adjacent to the target word line may be selected and refreshed as the adjacent word line of the target word line. When one redundancy word line among the redundancy word lines 1RWL1 to 1RWLJ is selected and refreshed as the target word line during the first target refresh operation, one redundancy word line adjacent to the target word line may be selected and refreshed as the adjacent word line of the target word line.

Subsequently, the address CNT_ADD1 corresponding to the normal word lines 1WL1 to 1WLK is counted whenever the refresh command RFC is applied until the refresh command RFC is inputted from a $(R+M+1)^{th}$ time for a $(2R-1)^{th}$ time. Therefore, the normal refresh operation in which (N−1) normal word lines among the normal word lines 1WL1 to 1WLK are sequentially refreshed is performed fourth.

Subsequently, the address CNT_ADD2 corresponding to the redundancy word lines 1RWL1 to 1RWLJ is counted in response to the refresh command RFC that is inputted at a $2R^{th}$ time. Therefore, the redundancy refresh operation in which the second redundancy word line 1RWL2 among the redundancy word lines 1RWL1 to 1RWLJ is refreshed is performed second.

Subsequently, the address CNT_ADD1 corresponding to the normal word lines 1WL1 to 1WLK is counted whenever the refresh command RFC is applied until the refresh command RFC is inputted from a $(2R+1)^{th}$ time to a $(2R+M-1)^{th}$ time. Therefore, the normal refresh operation in which (M−1) normal word lines among the normal word lines 1WL1 to 1WLK are sequentially refreshed is performed fifth.

As described above, the normal word lines 1WL1 to 1WLK and the redundancy word lines 1RWL1 to 1RWLJ are sequentially refreshed while the normal refresh operation, the target refresh operation and the redundancy refresh operation are alternately repeated in predetermined order.

The normal refresh operation is performed until the normal word lines 1WL1 to 1WLK are sequentially refreshed. Similarly, the target refresh operation is performed until the target word line, which is set in advance, and the word line which is disposed adjacent to the target word line are refreshed. The redundancy refresh operation is performed until the redundancy word lines 1RWL1 to 1RWLJ are sequentially refreshed.

In general, the number of the normal word lines 1WL1 to 1WLK is overwhelmingly greater than the number of the redundancy word lines 1RWL1 to 1RWLJ. Therefore, as shown in the drawing, a moment JR when the redundancy word lines 1RWL1 to 1RWLJ are all refreshed may precede a moment JR+B when the normal word lines 1WL1 to 1WLK are all refreshed. In other words, the normal word lines 1WL1 to 1WLK are all refreshed just at the moment JR+B by additionally refreshing a portion of the normal word lines even after the redundancy word lines 1RWL1 to 1RWLJ are all refreshed.

In general, the number of the target word lines and the word lines disposed adjacent to the target word line is overwhelmingly smaller than the number of the normal word lines 1WL1 to 1WLK. Therefore, although it is not directly illustrated in the drawing, a moment (not shown) when the target word lines and the word lines adjacent to the target word line are all refreshed precedes the moment JR+B when the normal word lines 1WL1 to 1WLK are all refreshed. In other words, the normal word lines 1WL1 to 1WLK are all refreshed just at the moment JR+B by additionally refreshing a portion of the normal word lines even after the target word lines and the word lines adjacent to the target word line are all refreshed.

The address CNT_ADD3 corresponding to the normal word line adjacent to the redundancy word lines 1RWL1 to 1RWLJ among the normal word lines 1WL1 to 1WLK is counted when the refresh command RFC is additionally inputted at a moment JR+B+1 after the normal word lines 1WL1 to 1WLK and the redundancy word lines 1RWL1 to 1RWLJ are refreshed once or more while the redundancy refresh operation, the target refresh operation and the normal refresh operation are performed. Therefore, an additional refresh operation is performed on one normal word line adjacent to the redundancy word lines 1RWL1 to 1RWLJ among the normal word lines 1WL1 to 1WLK.

The refresh operation on the first cell block 500<1> is completed in response to the additional refresh operation that are performed, Subsequently, the refresh operations on the other cell blocks 500<2:5> are sequentially performed, similarly to the refresh operation on the first cell block 500<1>.

Although the drawing illustrates that the moment when the target refresh operation is performed precedes the moment when the redundancy refresh operation is performed, this is just one of the embodiments and may be arranged differently under actual conditions. For example, the moment when the redundancy refresh operation is performed may be set to precede the moment when the target refresh operation is performed. That is, the redundancy refresh operation may be performed whenever the refresh command RFC is applied at an $M^{th}$ time, and the target refresh operation may be performed whenever the refresh command RFC is applied at an $(M+N)^{th}$ time. Therefore, the order of moments (not shown) when the target word lines and the word lines adjacent to the target word line are all refreshed and the moment JB when the redundancy word lines 1RWL1 to 1RWLJ are all refreshed may be different depending on the system design. However, the two moments may precede the moment JB+B when the normal word lines 1WL1 to 1WLK are refreshed.

As the target word line whose the number of times being activated is equal to or greater than a predetermined number of times and the word line which is disposed adjacent to the target word line are refreshed as described above in accordance with the embodiment of the present invention, the data of the memory cells coupled with the word lines may be prevented from being damaged due to word line disturbance.

Also, when the target word line is a redundancy word line which is substituted for a normal word line, the target refresh operation may be prevented from malfunctioning due to a repair operation as an adjacent word line of the redundancy word line is refreshed.

Furthermore, even when a redundancy word line disposed adjacent to normal word lines is a target word line, a normal word line adjacent to the redundancy word line is additionally refreshed as an adjacent word line of the target word line and a data of a memory cell coupled with the adjacent word line may be prevented from being damaged.

Second Embodiment

Figure 7:
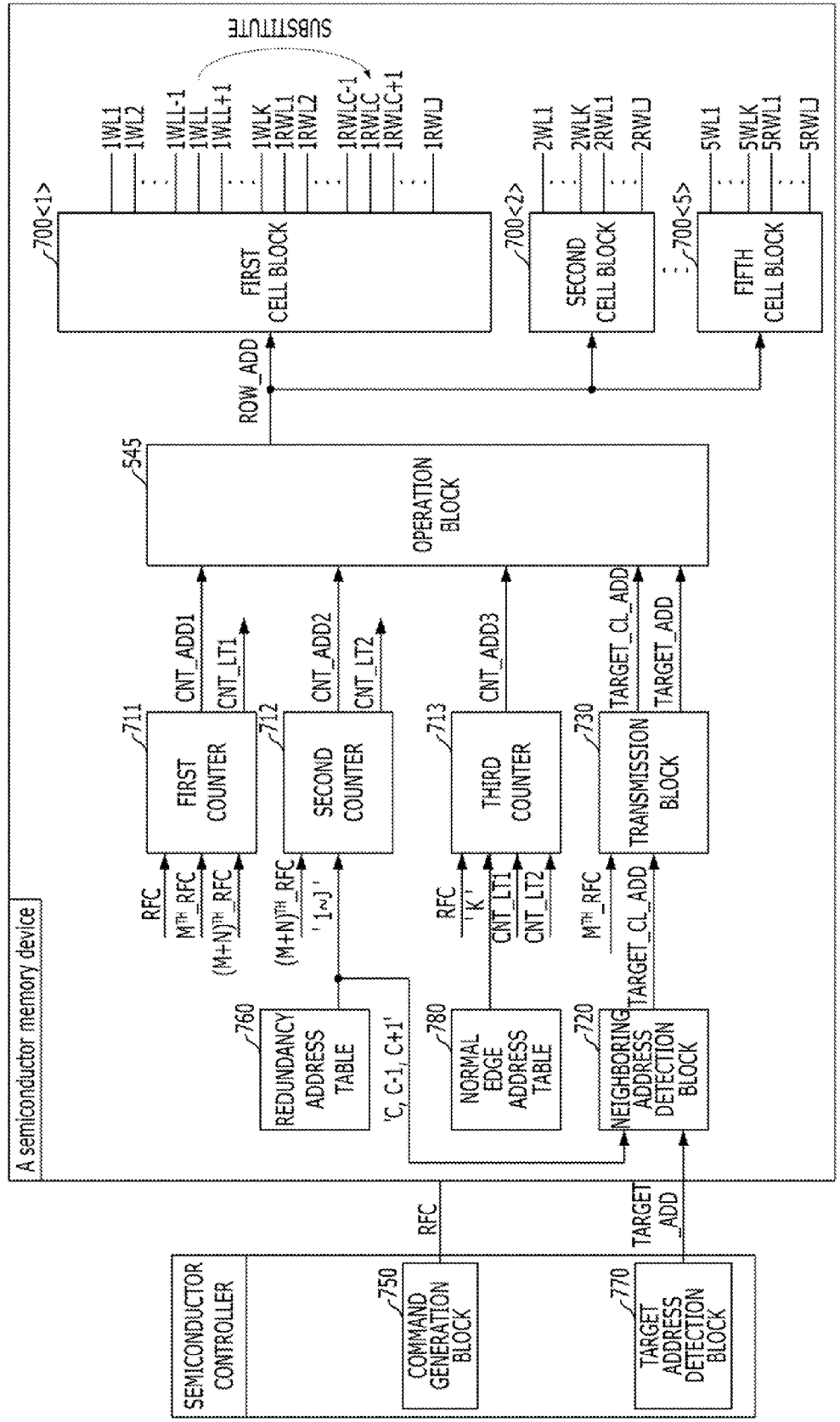
FIG. 7 a block diagram illustrating a semiconductor memory device in accordance with a second embodiment of the present invention.

FIG. 7 a block diagram illustrating a semiconductor memory device in accordance with a second embodiment of the present invention.

Referring to FIG. 7, the semiconductor memory system in accordance with the second embodiment of the present invention includes a semiconductor memory device and a semiconductor controller. The semiconductor memory device include a plurality of cell blocks 700<1:5> a neighboring address detection block 720, a first counter 711, a second counter 712, a third counter 713, a transmission block 730, an operation block 740, a redundancy address table 760 and a normal edge address table 780. Each of the cell blocks 700<1:5> includes a plurality of normal word lines 1WL1 to 1WLK, 2WL1 to 2WLK, 3WL1 to 3WLK, 4WL1 to 4WLK or 5WL1 to 5WLK and a plurality of redundancy word lines 1RWL1 to 1RWLJ, 2RWL1 to 2RWLJ, 3RWL1 to 3RWLJ, 4RWL to 4RWLJ or 5RWL to 5RWLJ. The semiconductor controller includes a command generation block 750 and a target address detection block 770.

The cell blocks 700<1:5> are physically divided. The normal word lines 1WL1 to 1WLK, 2WL1 to 2WLK, 3WL1 to 3WLK, 4WL1 to 4WLK or 5WL1 to 5WLK and the redundancy word lines 1RWL1 to 1RWLJ, 2RWL1 to 2RWLJ, 3RWL1 to 3RWLJ, 4RWL to 4RWLJ or 5RWL to 5RWLJ included in each of the cell blocks 700<1:5> are disposed adjacent to each other.

Herein, the cell blocks 700 1:5> have the same structure. Therefore, the following description is made on the basis of an operation to be performed in the first cell block 700<1> among the cell blocks 700<1:5>. An extended structure is described in an operation where all the cell blocks 700<1:5> are required.

The semiconductor controller detects a normal word line whose active history satisfies a predetermined condition among the normal word lines 1WL1 to 1WLK as a target word line and transmits a detection result TARGET_ADD to the semiconductor memory device. Also, the semiconductor controller generates and transmits a refresh command RFC to the semiconductor memory device.

Although not illustrated in the drawing, the semiconductor controller directly controls an active operation of the semiconductor memory device by generating and transmitting an active command and an active operation address to the semiconductor memory device, Therefore, the target address detection block 770 included in the semiconductor controller may detect the normal word line whose active history satisfies the predetermined condition among the normal word lines 1WL1 to 1WLK included in the semiconductor memory device as the target word line in the manner of detecting a value of the active operation address.

The command generation block 750 generates the refresh command RFC. The command generation block 750 also generates commands such as an active command and a precharge command other than the refresh command RFC.

The target address detection block 770 detects the normal word line whose active history satisfies the predetermined condition among the normal word lines 1WL1 to 1WLK as the target word line. To be specific, the target address detection block 770 detects a target address TARGET_ADD corresponding to the target word line 1WLL or 1RWLC whose active history satisfies the predetermined condition among the normal word lines 1WL1 to 1WLK and the redundancy word lines 1RWL1 to 1RWLJ.

The semiconductor memory device sequentially refreshes the normal word lines 1WL1 to 1WLK and the redundancy word lines 1RWL1 to 1RWLJ whenever the refresh command RFC is applied and additionally refreshes the target word line, a word line which is disposed adjacent to the target word line and a word line which is disposed adjacent to the redundancy word lines 1RWL1 to 1RWLJ among the normal word lines 1WL1 to 1WLK. The information on the target word line is transmitted from the semiconductor controller, and the information on the word line which is disposed adjacent to the target word line is generated inside of the semiconductor memory device.

The neighboring address detection block 720 detects a target neighboring address TARGET_CL_ADD corresponding to the word line which is disposed adjacent to the target word line by performing a predetermined operation on the target address TARGET_ADD which is transmitted from the target address detection block 770 included in the semiconductor controller.

When one normal word line WLL among the normal word lines 1WL1 to 1WLK is detected as a target word line from the target address detection block 770, one or more normal word lines 1WLL−1 and 1WLL+1, which are disposed adjacent to the normal word lines 1WLL detected by the target address detection block 770, may be adjacent word lines of the target word line. When one redundancy word line 1RWLC, which is substituted for one normal word line 1WLL among the normal word lines 1WL1 to 1WLK through a repair operation, among the redundancy word lines 1RWL1 to 1RWLJ is detected as the target word line from the target address detection block 770, one or more redundancy word lines 1RWLC−1 and 1RWLC+1, which are disposed adjacent to the redundancy word line 1RWLC detected by the target address detection block 770, may be adjacent word lines of the target word line.

The way the neighboring address detection block 720 operates may be changed based on whether the word line corresponding to the target address TARGET_ADD is a normal word line 1WLL or a redundancy word line 1RWLC. In other words, the neighboring address detection block 720 detects the target neighboring address TARGET_CL_ADD corresponding to the adjacent word lines 1WLL−1 and 1WL+1 or 1RWLC−1 and 1RWLC+1, of the target word line 1WLL or 1RWLC by performing a predetermined operation on the target address TARGET_ADD.

To be specific, when a value 'L' of an address corresponding to one normal word line 1WLL among the normal word lines 1WL1 to 1WLK is detected as the target address TARGET_ADD from the target address detection block 770, the neighboring address detection block 720 determines values 'L−1 and L+1' of the target neighboring address TARGET_CL_ADD through an operation of adding or subtracting 1 to or from a value 'L' of the target address TARGET_ADD. When a value 'C' of an address corresponding to a redundancy word line 1RWLC, which is substituted for the normal word line 1WLL among the normal word lines 1WL1 to 1WLK through a repair operation, among the redundancy word lines 1RWL1 to 1RWLJ is detected as the target address TARGET_ADD from the target address detection block 770, the neighboring address detection block 720 selects values 'C−1 and C+1' of the addresses corresponding to one or more redundancy word lines 1RWLC−1 and 1RWLC+1 which are disposed adjacent to the redundancy word line 1RWLC corresponding to the target address TARGET_ADD from the redundancy address table 760 and detects the target neighboring address TARGET_CL_ADD.

The normal word line 1WLK among the normal word lines 1WL1 to 1WLK is disposed adjacent to the redundancy word lines 1RWL1 to 1RWLJ, i.e., the outermost redundancy word line 1RWL1 among the redundancy word lines 1RWL1 to 1RWLJ A value 'K' of an address corresponding to the normal word line 1WLK which is disposed adjacent to the outermost redundancy word line 1RWL1 disposed next to the normal word lines 1WL1 to 1WLK among the redundancy word lines 1RWL1 to 1RWLJ is gathered in the normal edge address table 780. In a case of the first block 700<1> among the cell blocks 700<1:5>, the one normal word line 1WLK is disposed adjacent to the redundancy word lines 1RWL1 to 1RWLJ. However, in a case of all the cell blocks 700<1:5>, the number of the normal word lines disposed adjacent to the redundancy word lines may be 5 which is the same as the number of the cell blocks.

In the drawing, the normal word lines 1WL1 to 1WLK and the redundancy word lines 1RWL1 to 1RWLJ are grouped in one cell block, Just one normal word line 1WLK which is disposed adjacent to the redundancy word lines 1RWL1 to 1RWLJ exists in one cell block. However, unlike the illustration in the drawing, when a plurality of cell mats (not shown) are included in one cell block, and the normal word lines 1WL1 to 1WLK and the redundancy word lines 1RWL1 to 1RWLJ are grouped in each mat, the number of the normal word lines 1WLK which are disposed adjacent to the redundancy word lines IRMA to 1RWLJ may increase.

Values 1 to J of addresses corresponding to the redundancy word lines 1RWL1 to 1RWLJ are gathered in the redundancy address table 760. Since the redundancy word lines 1RWL1 to 1RWLJ are used for substituting for defective word lines among the normal word lines 1WL1 to 1WLK, the values 1 to J of the addresses corresponding to the redundancy word lines 1RWL1 to 1RWLJ may be the values of the addresses corresponding to J defective normal word lines among the normal word lines 1WL1 to 1WLK.

The operations of the semiconductor memory device are defined in detail based on the aforementioned structure. The semiconductor memory device performs a first refresh operation to sequentially refresh the no al word lines 1WL1 to 1WLK whenever the refresh command RFC is applied. The semiconductor memory device performs a second refresh operation to sequentially refresh the target word line 1WLL or 1RWLC and the word lines 1WLL−1 and 1WLL+1 or 1RWLC−1 and 1RWLC+1 which are disposed adjacent to the target word line 1WLL or 1RWLC while the first refresh operation stops whenever the refresh command RFC is applied at an $M^{th}$ time $M^{th}\_RFC$. The semiconductor memory device performs a third refresh operation to sequentially refresh the redundancy word lines 1RWL1 to 1RWLJ while the first refresh operation stops whenever the refresh command RFC is applied at a $(M+N)^{th}$ time $(M+N)^{th}\_RFC$. The semiconductor memory device performs a fourth refresh operation to refresh the word line 1WLK which is disposed adjacent to the redundancy word lines 1RWL1 to 1RWLJ among the normal word lines 1WL1 to 1WLK whenever the refresh command RFC is applied after the normal word lines 1WL1 to 1WLK and the redundancy word lines 1RWL1 to 1RWLJ are refreshed one or more times during the first to third refresh operations.

Although the first refresh operation is essentially performed whenever the refresh command RFC is applied, the second refresh operation is performed while the first refresh operation stops whenever the refresh command RFC is applied at the $M^{th}$ time $M^{th}\_RFC$. For example, the first refresh operation is performed until the refresh command RFC is applied from a first time to an $(M−1)^{th}$ time $(M−1)^{th}\_RFC$, and then the second refresh operation is performed when the refresh command RFC is applied at the $M^{th}$ time $M^{th}\_RFC$. Subsequently the first refresh operation is performed until the refresh command RFC is applied from an $(M+1)^{th}$ time $(M+1)^{th}\_RFC$ to a $(2M−1)^{th}$ time $(2M−1)^{th}\_RFC$, and then the second refresh operation is performed when the refresh command RFC is applied at a $2M^{th}$ time $2M^{th}\_RFC$.

Similarly, although the first refresh operation is essentially performed whenever the refresh command RFC is applied, the third refresh operation is performed while the first refresh operation stops whenever the refresh command RFC is applied at the $(M+N)^{th}$ time $(M+N)^{th}\_RFC$. For example, the first refresh operation is performed until the refresh command RFC is applied from a first time to an $(M+N−1)$ time $(M+N−1)^{th}\_RFC$, and then the third refresh operation is performed when the refresh command RFC is applied at the $(M+N)^{th}$ time $(M+N)^{th}\_RFC$. Subsequently the first refresh operation is performed until the refresh command RFC is applied from an $(M+N+1)^{th}$ time $(M+N+1)^{th}\_RFC$ to a $(2M+2N−1)^{th}$ time $(2M+2N−1)^{th}\_RFC$, and then the third refresh operation is performed when the refresh command RFC is applied at a $2(M+N)^{th}$ time $2(M+N)^{th}\_RFC$.

The first counter 711 sequentially counts the values 1 to K of the addresses corresponding to the normal word lines 1WL1 to 1WLK and outputs an address CNT_ADD1 whenever the refresh command RFC is applied, and the counting operation stops whenever the refresh command RFC is applied at the $M^{th}$ time $M^{th}\_RFC$ and the $(M+N)^{th}$ time $(M+N)^{th}\_RFC$.

The transmission block 730 sequentially outputs the target address TARGET_ADD and the target neighboring address TARGET_CL_ADD which are generated in the target address detection block 770 and the neighboring address detection block 720 whenever the refresh command RFC is applied at the $M^{th}$ time $M^{th}\_RFC$.

The second counter 712 counts the values 1 to J of the addresses corresponding to the redundancy word lines 1RWL1 to 1RWLJ and outputs an address CNT_ADD2 whenever the refresh command RFC is applied at the $(M+N)^{th}$ time $(M+N)^{th}\_RFC$. The values 1 to 3 of the addresses corresponding to the redundancy word lines 1RWL1 to 1RWLJ are already stored in the redundancy address table 760, and they may be the values which are selected as much as J among the values 1 to K of the addresses corresponding to the normal word lines 1WL1 to 1WLK through the repair operation.

The third counter 713 counts the value 'K' of the address corresponding to the normal word line 1WLK adjacent to the redundancy word lines 1RWL1 to 1RWLJ among the normal word lines 1WL1 to 1WLK and outputs an address CNT_ADD3 in response to the refresh command RFC applied after counting all the normal word lines 1WL1 to 1WLK and the redundancy word lines 1RWL1 to 1RWLJ in the first counter 711 and the second counter 712. The address corresponding to the normal word line 1WLK adjacent to the redundancy word lines 1RWL1 to 1RWLJ among the normal word lines 1WL1 to 1WLK has a value which is already stored in the normal edge address table 780, and the number and the value of the address may be determined based on the number of the cell blocks 700 1:5> or the number of the cell mats (not shown) which may be included in each of the cell blocks 700<1:5>. The third counter 713 counts the value 'K' of the address corresponding to the normal word line 1WLK adjacent to the redundancy word lines 1RWL1 to 1RWLJ among the normal word lines 1WL1 to 1WLK and outputs the address CNT_ADD3 in response to the refresh command RFC applied after a signal CNT_LT1 indicating that the counting operation of the first counter 711 is completed and a signal CNT_LT2 indicating that the counting operation of the second counter 7122 is completed are enabled.

The operation block 740 performs a refresh operation which activates-precharges the normal word lines 1WL1 to 1WLK and the redundancy word lines 1RWL1 to 1RWLJ in response to the address CNT_ADD1 outputted from the first counter 711, the address CNT_ADD2 outputted from the second counter 712, the address CNT_ADD3 outputted from the third counter 713 and the addresses TARGET_ADD and TARGET_CL_ADD outputted from the transmission block 730.

The difference between the structure of the semiconductor system in accordance with the second embodiment of the present invention with reference to FIG. 7 and the structure of the semiconductor memory device in accordance with the first embodiment of the present invention with reference to FIG. 5 is as follows.

The difference is whether the structure for detecting the target address TARGET_ADD exists inside the semiconductor memory device.

Therefore, the refresh operation shown in FIG. 6 may be applied to the operation of the semiconductor system in accordance with the second embodiment of the present invention shown in FIG. 7 as it is, and a detailed description thereon is omitted herein.

As described above, in accordance with the second embodiment of the present invention, a data of a memory cell coupled with the word lines may be prevented from being damaged due to a word line disturbance as a target word line whose the number of times being activated is equal to or greater than a predetermined number of times and a word line which is disposed adjacent to the target word line are refreshed.

Also, when the target word line is a redundancy word line which is substituted for a normal word line, a target refresh operation may be prevented from malfunctioning due to a repair operation as an adjacent word line of the redundancy word line is refreshed as the word line which is disposed adjacent to the target word line.

Also, even when a redundancy word line disposed adjacent to normal word lines is a target word line, a normal word line adjacent to the redundancy word line is additionally refreshed as an adjacent word line of the target word line and a data of a memory cell coupled with the adjacent word fine may be prevented from being damaged.

Furthermore, the target refresh operation may be stably performed even while the increase in the size of a semiconductor memory device is minimized by employing a circuit for detecting the target word line in a semiconductor controller.

While the present invention has been described with respect to the specific embodiments, it is noted that the embodiments of the present invention are not restrictive but descriptive. Further, it is noted that the present invention may be achieved in various ways through substitution, change, and modification, by those skilled in the art without departing from the scope of the present invention as defined by the following claims.

For example, although five cell blocks 500<1:5> and 700<1:5> are described as a plurality of cell blocks in the embodiments of the present invention, this is just one exemplary embodiment, and more or less cell blocks may be included.

What is claimed is:

1. A semiconductor memory device, comprising:
   a plurality of normal word lines and a plurality of redundancy word lines which are disposed adjacent to the normal word lines;
   a detection block suitable for detecting a first word line whose active history satisfies a predetermined condition and a second word line adjacent to the first word line as a target word line and a target neighboring word line, among the normal word lines and the redundancy word lines; and
   a control block suitable for sequentially refreshing the normal word lines and the redundancy word lines whenever a refresh command is applied, and additionally refreshing the target word line, the target neighboring word line and a normal word line adjacent to the redundancy word lines among the normal word lines.

2. The semiconductor memory device of claim wherein the control block performs:
   a first refresh operation to sequentially refresh the normal word lines whenever the refresh command is applied;
   a second refresh operation to sequentially refresh the target word line and the target neighboring word line while stopping the first refresh operation whenever the refresh command is applied at an $M^{th}$ time;
   a third refresh operation to sequentially refresh the redundancy word lines while stopping the first refresh operation whenever the refresh command is applied at an $(M+N)^{th}$ time; and
   a fourth refresh operation to refresh the normal word line adjacent to the redundancy word lines among the normal word fines in response to the refresh command applied after the first to third refresh operations are performed,
   wherein the M and N include a natural number greater than 1.

3. The semiconductor memory device of claim 2, wherein in when one normal word line among the normal word lines is detected as the target word line, the detection block detects one or more normal word lines, which are disposed adjacent to the one normal word line among the normal word lines, as the target neighboring word line, and
   when one redundancy word line, which is substituted for one normal word line among the normal word lines through a repair operation among the redundancy word lines, is detected as the target word line, the detection block detects one or more redundancy word line, which are disposed adjacent to the one redundancy word line among the redundancy word lines, as the target neighboring word line.

4. The semiconductor memory device of claim 1, wherein the detection block detects a target address corresponding to the target word line and detects a target neighboring address corresponding to the target neighboring word line by performing a predetermined operation on the target address.

5. The semiconductor memory device of claim 4, wherein the control block includes:
   a first counter suitable for sequentially counting addresses corresponding to the normal word lines whenever the refresh command is applied, and stopping a counting operation whenever the refresh command is applied at an M time and an $(M+N)^{th}$ time;
   a transmitter suitable for sequentially outputting the target address and the target neighboring address detected by the detection block whenever the refresh command is applied at the $M^{th}$ time;
   a second counter suitable for sequentially counting addresses corresponding to the redundancy word lines whenever the refresh command is applied at the $(M+N)^{th}$ time;
   a third counter suitable for counting an address corresponding to the normal word line adjacent to the redundancy word lines among the normal word lines, in response to the refresh command applied after counting all the normal word lines and the redundancy word lines in the first and second counters; and
   an operator suitable for refreshing the normal word lines and the redundancy word lines in response to addresses which are outputted from the first to third counters and the transmitter,
   wherein the M and N include a natural number greater than 1.

6. The semiconductor memory device of claim 5, further comprising:
   a redundancy address table suitable for gathering the addresses corresponding to the redundancy word lines to be counted by the second counter.

7. The semiconductor memory device of claim 6, further comprising:
   a normal edge address table suitable for gathering the address, corresponding to the normal word line which is disposed adjacent to the redundancy word lines among the normal word lines, to be counted by the third counter.

8. The semiconductor memory device of claim 6, wherein when an address corresponding to one normal word line among the normal word lines is detected as the target address, the detection block determines a value of the target neighboring address through an operation of adding or subtracting 1 to or from a value of the target address, and when an address corresponding to one redundancy word line, which is substituted for one normal word line among the normal word lines through a repair operation among the redundancy word lines, is detected as the target address, the detection block determines the value of the target neighboring address by selecting values of addresses corresponding to one or more redundancy word lines, which are disposed adjacent to the one redundancy word line among the redundancy word lines, from the redundancy address table.

9. The semiconductor memory device of claim 1, wherein the normal word line adjacent to the redundancy word lines among the normal word lines includes an outermost word line among the normal word lines, which is disposed adjacent to an outermost redundancy word line among the redundancy word lines.

10. A semiconductor system, comprising:
a semiconductor memory device including a plurality of normal word lines and a plurality of redundancy word lines which are disposed adjacent to the normal word lines, and suitable for sequentially refreshing the normal v cord lines and the redundancy word lines whenever a refresh command is applied, and additionally refreshing a target word line, a target neighboring word line adjacent to the target word line and a normal word line adjacent to the redundancy word lines among the normal word lines and the redundancy word lines; and
a semiconductor controller suitable for detecting a word line whose active history satisfies a predetermined condition among the normal word lines and the redundancy word lines as the target word line, and transmitting a detection result to the semiconductor memory device.

11. The semiconductor system of claim 10, wherein the semiconductor memory device performs:
a first refresh operation to sequentially refresh the normal word lines whenever the refresh command is applied;
a second refresh operation to sequentially refresh the target word line and the target neighboring word line while stopping the first in refresh operation whenever the refresh command is applied at an $M^{th}$ time;
a third refresh operation to sequentially refresh the redundancy word lines while stopping the first refresh operation whenever the refresh command is applied at an $(M+N)^{th}$ time; and
a fourth refresh operation to refresh the normal word line adjacent to the redundancy word lines in response to the refresh command applied after the first to third refresh operations are performed,
wherein the M and N include a natural number greater than 1.

12. The semiconductor system of claim 1, wherein when one normal word line among the normal word lines is detected as the target word line from the semiconductor controller, the semiconductor memory device detects one or more normal word lines, which are disposed adjacent to the one normal word line among the normal word lines, as the target neighboring word line, and when one redundancy word line, which is substituted for one normal word line among the normal word lines through a repair operation among the redundancy word lines, is detected as the target word line from the semiconductor controller, the semiconductor memory device detects one or more redundancy word lines, which are disposed adjacent to the one redundancy word line among the redundancy word lines, as the target neighboring word line.

13. The semiconductor system of claim 10, wherein the semiconductor controller detects a target address corresponding to the target word line and transmits the target address to the semiconductor memory device.

14. The semiconductor system of claim 13, wherein the semiconductor memory device includes:
a neighboring address detector suitable for detecting a target neighboring address corresponding to the target neighboring word line by performing a predetermined operation on the target address which is transmitted from the semiconductor controller;
a first counter suitable for sequentially counting addresses corresponding to the normal word lines whenever the refresh command is applied, and stopping a counting operation whenever the refresh command is applied at an $M^{th}$ time and an $(M+N)^{th}$ time;
a transmitter suitable for sequentially outputting the target address which is transmitted from the semiconductor controller and the target neighboring address which are detected by the neighboring address detector whenever the refresh command is applied at the $M^{th}$ time;
a second counter suitable for sequentially counting addresses corresponding to the redundancy word lines whenever the refresh command is applied at the $(M+N)^{th}$ time;
a third counter suitable for counting an address, corresponding to the normal word line adjacent to the redundancy word lines, in response to the refresh command applied after counting all the normal word lines and the redundancy word lines in the first and second counter; and
an operator suitable for refreshing the normal word lines and the redundancy word lines in response to addresses which are outputted from the first to third counters and the transmitter,
wherein the M and N include a natural number greater than 1.

15. The semiconductor system of claim 14, further comprising:
a redundancy address table suitable for gathering the addresses corresponding to the redundancy word lines to be counted by the second counter.

16. The semiconductor system of claim 15, further comprising:
a normal edge address table suitable for gathering the addresses corresponding to the normal word lines adjacent to the redundancy word lines, to be counted by the third counter.

17. The semiconductor system of claim 15, wherein when an address corresponding to one normal word line among the normal word lines is detected as the target address from the semiconductor controller, the neighboring address detector determines a value of the target neighboring address through an operation of adding or subtracting 1 to or from a value of the target address, and when an address corresponding to one redundancy word line, which is substituted for one normal word line among the normal word lines through a repair operation among the redundancy word lines, is detected as the target address from the semiconductor controller, the neighboring address detector determines the value of the target neighboring address by selecting values of addresses corresponding to one or more redundancy word lines, which are disposed adjacent to the one redundancy word line among the redundancy word lines, from the redundancy address table.

18. The semiconductor system of claim 10, wherein the normal word line adjacent to the redundancy word lines includes an outermost word line among the normal word lines, which is disposed adjacent to an outermost redundancy word line among the redundancy word lines.

19. The semiconductor system of claim 10, wherein the semiconductor controller generates and transmits the refresh command to the semiconductor memory device.

* * * * *